United States Patent
Demir et al.

(10) Patent No.: US 7,280,618 B2
(45) Date of Patent: Oct. 9, 2007

(54) DIGITAL BASEBAND RECEIVER INCLUDING A HIGH PASS FILTER COMPENSATION MODULE FOR SUPPRESSING GROUP DELAY VARIATION DISTORTION INCURRED DUE TO ANALOG HIGH PASS FILTER DEFICIENCIES

(75) Inventors: Alpaslan Demir, Commack, NY (US); Leonid Kazakevich, Plainview, NY (US); Tanbir Haque, Long Island, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 628 days.

(21) Appl. No.: 10/747,644

(22) Filed: Dec. 29, 2003

(65) Prior Publication Data

US 2004/0264601 A1 Dec. 30, 2004

Related U.S. Application Data

(60) Provisional application No. 60/482,834, filed on Jun. 25, 2003.

(51) Int. Cl.
*H03D 3/00* (2006.01)
(52) U.S. Cl. ............... 375/322; 375/316; 375/324; 455/209; 455/130; 455/249.1
(58) Field of Classification Search ............... 375/322, 375/316, 324; 455/249, 209, 130, 249.1
See application file for complete search history.

(56) References Cited

U.S. PATENT DOCUMENTS 6,427,068 B1 7/2002 Suominen

| | | | |
|---|---|---|---|
| 6,549,763 B1 * | 4/2003 | Imai et al. ............... 455/249.1 |
| 2002/0064239 A1 | 5/2002 | Husth | |
| 2002/0090924 A1 | 7/2002 | Suominen | |
| 2003/0215028 A1 * | 11/2003 | Hammes et al. ............ 375/316 |
| 2004/0176055 A1 * | 9/2004 | Vepsalainen et al. ....... 455/130 |
| 2005/0070240 A1 | 3/2005 | Adler et al. | |

FOREIGN PATENT DOCUMENTS

WO 00/72441 11/2000
WO 02/47279 6/2002

* cited by examiner

Primary Examiner—Chieh M. Fan
Assistant Examiner—Eva Zheng
(74) Attorney, Agent, or Firm—Volpe and Koenig, P.C.

(57) ABSTRACT

A digital baseband (DBB) radio frequency (RF) receiver includes a digital high pass filter compensation (HPFC) module used to suppress group delay variation distortion caused by using low cost analog high pass filters (HPFs) in the receiver. The digital HPFC module reduces a cutoff frequency, established by the HPFs for the real and imaginary signal component frequency domain responses by providing a first compensation signal having a first predetermined value ($K_1$). The digital HPFC module adjusts the gain of the high pass response of the real and imaginary signal component frequency domains by providing a second compensation signal having a second predetermined value ($K_2$).

31 Claims, 4 Drawing Sheets

DIGITAL BASEBAND RECEIVER INCLUDING A HIGH PASS FILTER COMPENSATION MODULE FOR SUPPRESSING GROUP DELAY VARIATION DISTORTION INCURRED DUE TO ANALOG HIGH PASS FILTER DEFICIENCIES

CROSS REFERENCE TO RELATED APPLICATION

This application claims priority from U.S. Provisional Patent Application Ser. No. 60/482,834, filed Jun. 25, 2003, which is incorporated by reference as if fully set forth herein.

FIELD OF THE INVENTION

The present invention generally relates to receiver design in wireless communication systems. More particularly, the present invention relates to digital signal processing (DSP) techniques used to compensate for group delay variation distortion introduced in an analog radio receiver.

BACKGROUND

Existing wireless system architectural configurations impose stringent constraints on the system designer with regards to receiving communication signals. Moreover, such configurations often provide low reliability communication links, high operating costs, and an undesirably low level of integration with other system components.

As shown in FIG. 1, a conventional radio frequency (RF) receiver 100 includes an analog radio receiver 105, at least one analog to digital converter (ADC) 110, a controller 115 and a modem 120. The analog radio receiver 105 is a direct conversion receiver which includes an antenna 125 for receiving a wireless communication signal, a bandpass filter 130, a low noise amplifier (LNA) 135, an optional second filter 140 (e.g., bandpass filter), a demodulator 145 having two outputs 150, 155, a phase-locked loop (PLL) 160, an analog real signal path low pass filter (LPF) 165A, an analog imaginary signal path LPF 165B, first stage real signal path amplifier 170A, first stage imaginary signal path amplifier 170B, first stage analog real signal path high pass filter (HPF) 175A, first stage analog imaginary signal path HPF 175B, second stage real signal path amplifier 180A, second stage imaginary signal path amplifier 180B, second stage analog real signal path HPF 185A, and second stage analog imaginary signal path HPF 185B. Each of the amplifiers 170A, 170B, 180A, 180B, include of a high gain stage residing in the analog domain of the RF receiver 100.

The modem 120 controls the switching of the LNA 135. The PLL 160 generates a local oscillator (LO) signal to control the two outputs 150, 155 of the demodulator 145. The output 150 is an in-phase (I) output of the demodulator 145 for outputting a real signal component of the wireless communication signal. The output 155 is a quadrature (Q) output of the demodulator 145 for outputting an imaginary signal component of the wireless communication signal. The analog LPFs 165A, 165B, control the bandwidth selectivity of the I and Q outputs 150 and 155, respectively. The outputs of the analog LPFs 165A, 165B, are then amplified by the first and second stage amplifiers 170A, 170B, 180A, 180B, respectively.

Due to high gain requirements, the first and second stage analog HPFs 175A, 175B, 185A, 185B, are included in the analog radio receiver 105 to provide capacitance after each of the first and second amplifier stages 170A, 170B, 180A, 180B, respectively, whereby the first and second gain stages are AC-coupled and any residual direct current (DC) is removed to prevent DC offset. Each of the analog HPFs 175A, 175B, 185A, 185B, has a signal input, a signal output, at least one capacitor (C) which connects the signal input to the signal output, and at least one resistor (R) which connects the output of the capacitor to ground, thus forming an R-C filter. The analog HPFs 175A, 175B, 185A, 185B, alter the spectral shape (i.e., reducing the energy) of the lower portion (e.g., below 50 kHz) of the frequency domain response associated with the real and imaginary signal components.

In the conventional RF receiver 100 of FIG. 1, the ADC 110 is connected to the output of the second stage analog HPFs 185A, 185B. The ADC 110 outputs digital I and Q outputs 190, 195. The controller 115 maintains control over all of the active components of analog radio receiver 105 and the ADC 110.

In the analog radio receiver 105, the analog HPFs 175A, 175B, 185A, 185B, are utilized to guarantee the spectral shape of the wireless communication signal received via the antenna 125 before being sampled at the ADC 110. Typically, the specifications on the analog HPFs 175A, 175B, 185A, 185B, are very stringent such that the implementation requires high order filtering. Specifically, one such specification is error vector magnitude (EVM), which is a normalized mean squared error (MSE) measurement. Implementing high order filter designs for the analog HPFs 175A, 175B, 185A, 185B, may be complicated and expensive. Thus, the tolerances on parts for the analog HPFs 175A, 175B, 185A, 185B, may lead to unacceptable production yield. Reducing the design complexity of the analog HPFs 175A, 175B, 185A, 185B, may be accomplished with a lower order filter design with less stringent specifications. However, using such a filter design in the analog HPFs 175A, 175B, 185A, 185B, will result in the occurrence of a group delay variation distortion if no compensation is introduced after the analog HPFs 175A, 175B, 185A, 185B, thus degrading the performance of the RF receiver 100.

Because the costs of HPFs that process RF analog signals are higher than the components that use DSP, it is desired to provide a digital baseband (DBB) system, including a low cost receiver with low noise and minimal power requirements, which utilizes DSP techniques to compensate for group delay variation distortion caused by analog HPFs.

SUMMARY

The present invention is a DBB receiver for adjusting the frequency domain response of at least one of the real and imaginary signal components of a wireless communication signal to suppress group delay variation distortion caused by using low cost analog HPFs in the receiver. The receiver includes a demodulator, a digital high pass filter compensation (HPFC) module, at least one analog real signal path HPF, and at least one analog imaginary HPF. The digital HPFC module reduces a cutoff frequency (i.e., corner frequency), established by the analog HPFs for the real and imaginary signal component frequency domain responses, by providing a first compensation signal having a first predetermined value ($K_1$). The digital HPFC module adjusts the gain of the high pass response of the real and imaginary signal component frequency domains by providing a second compensation signal having a second predetermined value ($K_2$) signal.

The present invention may be incorporated into a DBB receiver, a wireless transmit/receive unit (WTRU), an integrated circuit (IC), a wireless communication system and method, or any other desired communication mechanism.

The demodulator has real and imaginary signal outputs. The demodulator receives the communication signal and outputs real and imaginary signal components of the communication signal on the real and imaginary signal outputs. The digital HPFC module has real and imaginary signal paths. The analog real HPF is in communication with the real signal output of the demodulator and the real signal path of the digital HPFC module. The analog imaginary HPF is in communication with the imaginary signal output of the demodulator and the imaginary signal path of the digital HPFC module. The digital HPFC module suppresses group delay variation distortion caused by at least one of the analog real and imaginary HPFs. The digital HPFC module may be selectively enabled or disabled.

The digital HPFC module may include a real signal input for receiving the real signal component, and a real compensated signal output for outputting a real compensated output signal. The digital HPFC module may further include first and second multipliers, first, second and third adders, and a first sample delay unit. The first multiplier may have first and second inputs and an output. The first input of the first multiplier may receive a first compensation signal having a first predetermined value ($K_1$). The first adder may have first and second inputs and an output. The first input of the first adder may be connected to the real signal input of the digital HPFC module, and the output of the first adder may be connected to the second input of the first multiplier. The second adder may have first and second inputs and an output. The first input of the second adder may be connected to the output of the first multiplier. The first sample delay unit may have an input and an output. The input of the first sample delay unit may be connected to the output of the second adder. The second multiplier may have first and second inputs and an output. The first input of the second multiplier may receive a second compensation signal having a second predetermined value ($K_2$). The second input of the second multiplier may be connected to the output of the first sample delay unit, to the second input of the second adder, and to the second input of the first adder. The third adder may have first and second inputs and an output. The first input of the third adder may be connected to the first input of the first adder. The second input of the third adder may be connected to the output of the second multiplier. The output of the third adder may be connected to the real compensated signal output of the digital HPFC module.

The output of the second multiplier may be subtracted from the real signal component via the third adder. The output of the first sample delay unit may be subtracted from the real signal component via the first adder.

The digital HPFC module may further include an imaginary signal input for receiving the imaginary signal component, and an imaginary compensated signal output for outputting an imaginary compensated output signal. The digital HPFC module may further include third and fourth multipliers, fourth, fifth and sixth adders, and a second sample delay unit. The third multiplier may have first and second inputs and an output. The first input of the third multiplier may receive the first compensation signal having the first predetermined value ($K_1$). The fourth adder may have first and second inputs and an output. The first input of the fourth adder may be connected to the imaginary signal input of the digital HPFC module, and the output of the fourth adder may be connected to the second input of the third multiplier. The fifth adder may have first and second inputs and an output. The first input of the fifth adder may be connected to the output of the third multiplier. The second sample delay unit may have an input and an output. The input of the second sample delay unit may be connected to the output of the fifth adder. The fourth multiplier may have first and second inputs and an output. The first input of the fourth multiplier may receive the second compensation signal having the second predetermined value ($K_2$). The second input of the fourth multiplier may be connected to the output of the second sample delay unit, to the second input of the fifth adder, and to the second input of the fourth adder. The sixth adder may have first and second inputs and an output. The first input of the sixth adder may be connected to the first input of the fourth adder. The second input of the sixth adder may be connected to the output of the fourth multiplier. The output of the sixth adder may be connected to the imaginary compensated signal output of the digital HPFC module.

The output of the fourth multiplier may be subtracted from the imaginary signal component via the sixth adder. The output of the second sample delay unit may be subtracted from the imaginary signal component via the fourth adder.

BRIEF DESCRIPTION OF THE DRAWING(S)

A more detailed understanding of the invention may be had from the following description of a preferred example, given by way of example and to be understood in conjunction with the accompanying drawing wherein.

DETAILED DESCRIPTION OF THE PREFERRED EMBODIMENTS

Figure 1:
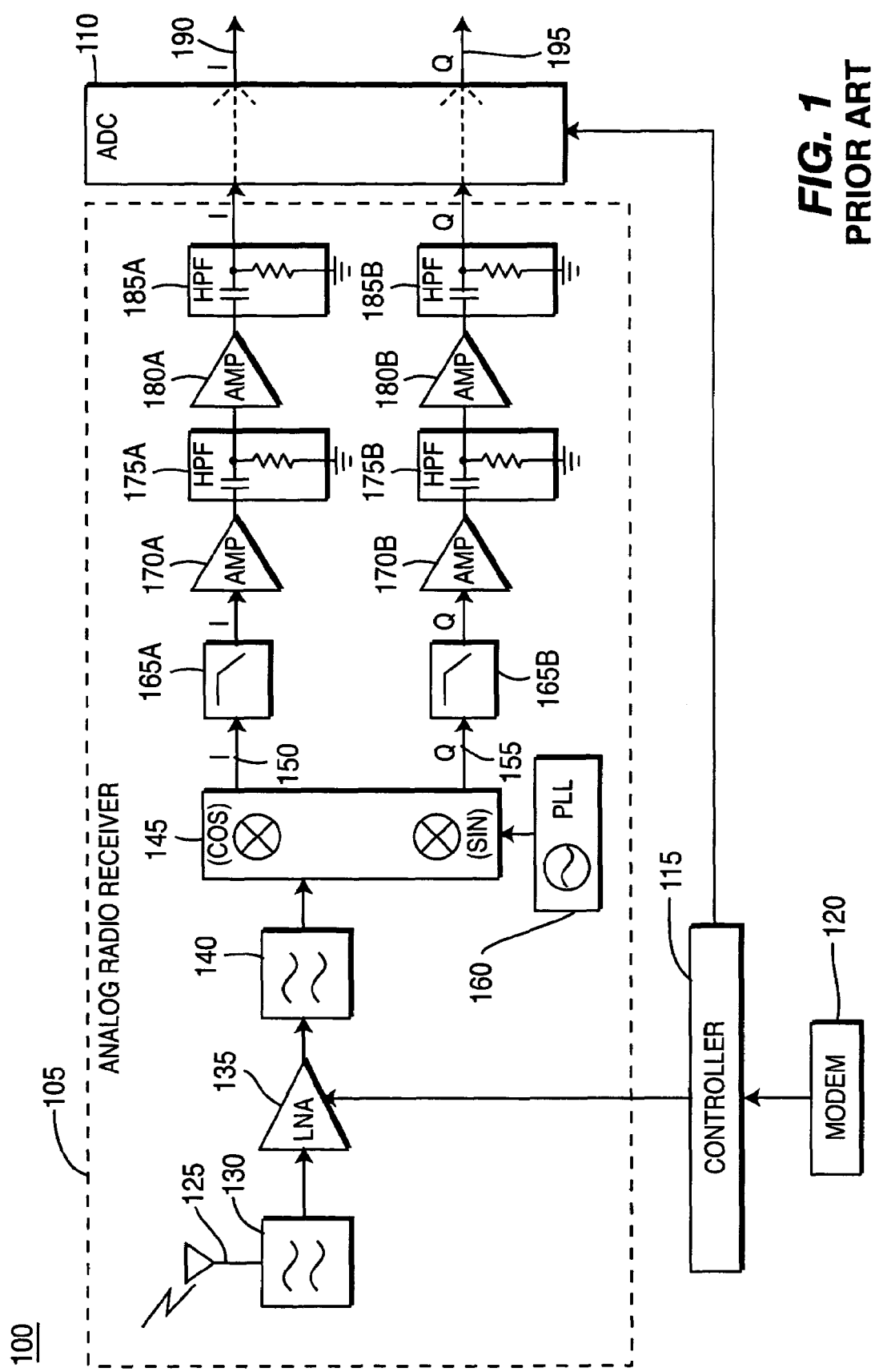
FIG. 1 is a block diagram of a conventional RF receiver including an analog radio receiver.
Figure 2:
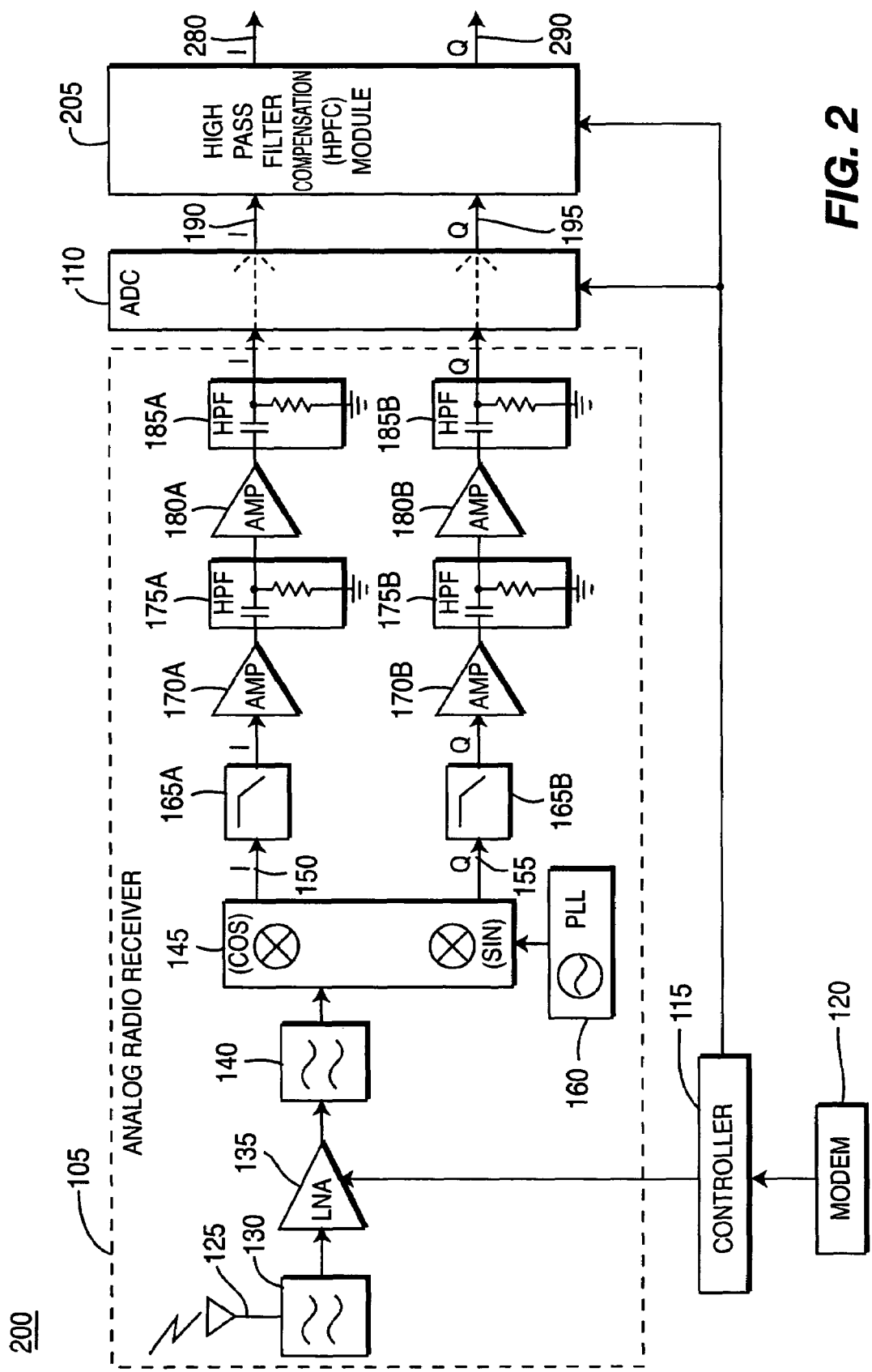
FIG. 2 is a block diagram of a DBB RF receiver with a digital high pass filter compensation module configured in accordance with a preferred embodiment of the present invention.

FIG. 2 is a block diagram of a DBB RF receiver 200, configured in accordance with a preferred embodiment of the present invention. Although the invention will be referred to in terms of being implemented upon a receiver 200, it should also be understood by those of skill in the art that the invention pertains equally to a transceiver.

Preferably, the method and system disclosed herein is incorporated into a wireless transmit/receive unit (WTRU). Hereafter, a WTRU includes but is not limited to a user equipment, mobile station, fixed or mobile subscriber unit, pager, or any other type of device capable of operating in a wireless environment. The features of the present invention may be incorporated into an integrated circuit (IC) or be configured in a circuit comprising a multitude of interconnecting components.

The present invention is applicable to communication systems using time division duplex (TDD), time division multiple access (TDMA), frequency division duplex (FDD), code division multiple access (CDMA), CDMA 2000, time division synchronous CDMA (TDSCDMA), and orthogonal frequency division multiplexing (OFDM). However, the present invention is envisaged to be applicable to other types of communication systems as well.

As shown in FIG. 2, the DBB RF receiver 200 includes a digital high pass filter compensation (HPFC) module 205 having real (I) and imaginary (Q) signal paths connected to the digital I and Q signal outputs 190, 195. The digital HPFC module 205 further includes compensated outputs 280, 290 and may be controlled by controller 115.

Figure 3:
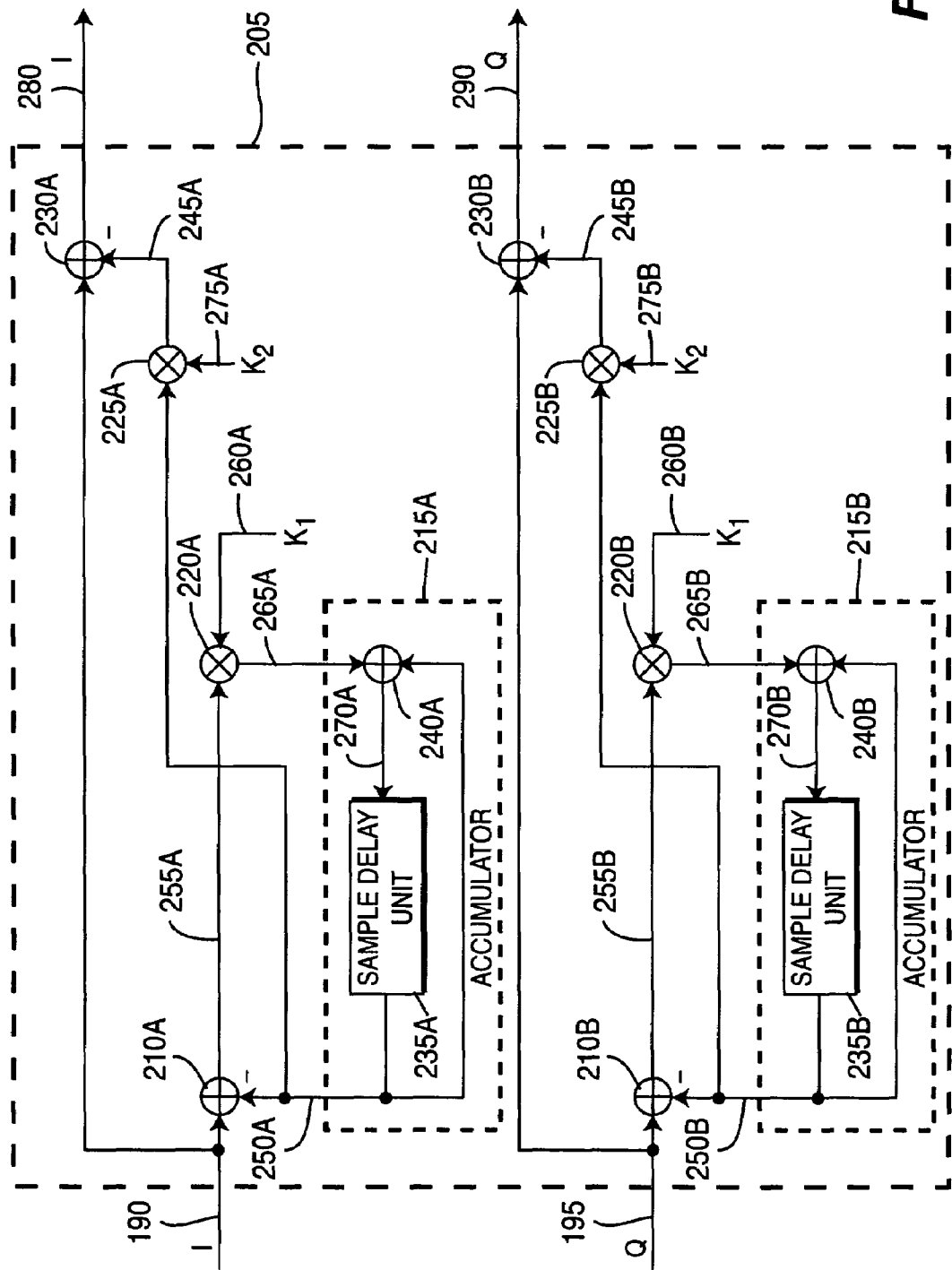
FIG. 3 shows an exemplary configuration of the digital high pass filter compensation module in the DBB RF receiver of FIG. 2.

FIG. 3 shows an exemplary configuration of the digital HPFC module 205 in the DBB RF receiver 200. The digital HPFC module 205 includes a digital circuit which expands the low frequency components (e.g., between 5 and 50 kHz) and reduces the cutoff frequency (i.e., corner frequency) established by the analog HPFs 175A, 175B, 185A, 185B such that the spectral shape of the frequency response domain altered by the analog HPFs 175A, 175B, 185A, 185B, is restored. Thus, the distortion introduced by the analog HPFs 175A, 175B, 185A, 185B, is suppressed. One or more additional digital HPFC modules 205 may be connected in series with the digital HPFC module 205 to provide additional compensation of distortion due to the analog HPFs 175A, 175B, 185A, 185B.

The digital HPFC module 205 includes real (I) and imaginary (Q) signal paths on which the real and imaginary signal components from the digital outputs 190, 195, of the ADC 110 are respectively passed. The digital HPFC module 205 is a digital filter having characteristics which are selected such that the frequency domain response of the digital HPFC module 205 will restore the frequency characteristics distorted by the analog HPFs 175A, 175B, 185A, 185B, in the analog radio receiver 105. When the frequency response of the digital HPFC module 205 is convolved with the frequency response of the analog HPFs 175A, 175B, 185A, 185B, the distortion caused by the analog HPFs 175A, 175B, 185A, 185B, is suppressed. Furthermore, the low frequency components that are filtered out by the analog HPFs 175A, 175B, 185A, 185B, are reconstructed by providing a digital filter having a low pass frequency response which is added to the high pass frequency response of the analog HPFs 175A, 175B, 185A, 185B. The real and imaginary signal paths of the digital HPFC module 205 have the same frequency characteristics for removing the distortion which occurs on each of the I and Q signal paths due to the group delay variation caused by the analog HPFs 175A, 175B, 185A, 185B. Thus, real and imaginary compensated signals output by real and imaginary compensated outputs 280, 290, of the digital HPFC module 205 do not include the distortion. The digital HPFC module may be selectively enabled or disabled, as determined by the controller 115.

As shown in FIG. 3, the digital HPFC module 205 includes adders 210A, 210B, 230A, 230B, accumulator circuits 215A, 215B, and multipliers 220A, 220B, 225A, 225B. The adders 230A, 230B, subtract real and imaginary HPF compensation signals 245A, 245B, from the real and imaginary signal components, respectively, in order to provide real and imaginary compensated outputs 280, 290, with expanded high pass frequency responses.

The accumulator circuit 215A includes a sample delay unit 235A and an adder 240A. An output of the adder 240A is connected to an input of the sample delay unit 235A. An output of the sample delay unit 235A is connected to a first input of the adder 240A. The accumulator circuit 215A outputs an accumulator output signal 250A which is subtracted from the real signal component, via the adder 210A, to generate an accumulator feedback signal 255A. A first compensation signal having a value $K_1$ and being received at an input 260A of the multiplier 220A is multiplied by the accumulator feedback signal 255A to generate a compensated accumulator feedback signal 265A which is input to a second input of the adder 240A. Thus, the adder 240A provides a sample signal 270A to the input of the sample delay unit 235A. The signal sample 270A consists of the sum of the compensated accumulator feedback signal 265A and the accumulator output signal 250A. A second compensation signal having a value $K_2$ and being received at an input 275A of the multiplier 225A is multiplied by the accumulator output signal 250A to generate the real HPF compensation signal 245A.

Still referring to FIG. 3, the accumulator circuit 215B includes a sample delay unit 235B and an adder 240B. An output of the adder 240B is connected to an input of the sample delay unit 235B. An output of the sample delay unit 235B is connected to a first input of the adder 240B. The accumulator circuit 215B outputs an accumulator output signal 250B which is subtracted from the imaginary signal component, via the adder 210B, to generate an accumulator feedback signal 255B. The first compensation signal having a value $K_1$ and being received at an input 260B of the multiplier 220B is multiplied by the accumulator feedback signal 255B to generate a compensated accumulator feedback signal 265B which is input to a second input of the adder 240B. Thus, the adder 240B provides a sample signal 270B to the input of the sample delay unit 235B. The signal sample 270B consists of the sum of the compensated accumulator feedback signal 265B and the accumulator output signal 250B. The second compensation signal having a value $K_2$ and being received at an input 275B of the multiplier 225B is multiplied by the accumulator output signal 250B to generate the imaginary HPF compensation signal 245B.

In summary, the digital HPFC module 205 includes a real signal input (output 190 of ADC 110) for receiving the real signal component (I), and a real compensated signal output 280 for outputting a real compensated output signal. The digital HPFC module 205 further includes first and second multipliers, 220A, 225A, first, second and third adders, 210A, 240A, 230A, and a first sample delay unit 235A. The first multiplier 220A has first and second inputs and an output. The first input 260A of the first multiplier 220A receives a first compensation signal having a first predetermined value ($K_1$). The first adder 210A has first and second inputs and an output. The first input of the first adder 210A is connected to the real signal input (output 190 of ADC 110) of the digital HPFC module 205, and the output of the first adder 210A is connected to the second input of the first multiplier 220A. The second adder 240A has first and second inputs and an output. The first input of the second adder 240A is connected to the output of the first multiplier 220A. The first sample delay unit 235A has an input and an output. The input of the first sample delay unit 235A is connected to the output of the second adder 240A. The second multiplier 225A has first and second inputs and an output. The first input 275A of the second multiplier 225A receives a second compensation signal having a second predetermined value ($K_2$). The second input of the second multiplier 225A is connected to the output of the first sample delay unit 235A, to the second input of the second adder 240A, and to the second input of the first adder 210A. The third adder 230A has first and second inputs and an output. The first input of the third adder 230A is connected to the first input of the first adder 210A. The second input of the third adder 230A is connected to the output of the second multiplier 225A. The output of the third adder 230A is connected to the real compensated signal output 280 of the digital HPFC module 205.

The output of the second multiplier 225A is subtracted from the real signal component via the third adder 230A. The output of the first sample delay unit 235A is subtracted from the real signal component via the first adder 210A.

Furthermore, the digital HPFC module 205 includes an imaginary signal input (output 195 of ADC 110) for receiving the imaginary signal component (Q), and an imaginary compensated signal output 290 for outputting an imaginary compensated output signal. The digital HPFC module 205 further includes third and fourth multipliers, 220B, 225B, fourth, fifth and sixth adders, 210B, 240B, 230B, and a second sample delay unit 235B. The third multiplier 220B has first and second inputs and an output. The first input 260B of the third multiplier 220B receives the first compensation signal having the first predetermined value ($K_1$). The fourth adder 210B has first and second inputs and an output. The first input of the fourth adder 210B is connected to the imaginary signal input (output 195 of ADC 110) of the digital HPFC module 205, and the output of the fourth adder 210B is connected to the second input of the third multiplier 220B. The fifth adder 240B has first and second inputs and an output. The first input of the fifth adder 240B is connected to the output of the third multiplier 220B. The second sample delay unit 235B has an input and an output. The input of the second sample delay unit 235B is connected to the output of the fifth adder 240B. The fourth multiplier 225B has first and second inputs and an output. The first input 275B of the fourth multiplier 225B receives the second compensation signal having a second predetermined value ($K_2$). The second input of the fourth multiplier 225B is connected to the output of the second sample delay unit 235B, to the second input of the fifth adder 240B, and to the second input of the fourth adder 210B. The sixth adder 230B has first and second inputs and an output. The first input of the sixth adder 230B is connected to the first input of the fourth adder 210B. The second input of the sixth adder 230B is connected to the output of the fourth multiplier 225B. The output of the sixth adder 230B is connected to the imaginary compensated signal output 290 of the digital HPFC module 205.

The output of the fourth multiplier 225B is subtracted from the imaginary signal component via the sixth adder 230B. The output of the second sample delay unit 235B is subtracted from the imaginary signal component via the fourth adder 210B.

The cutoff frequency of the real and imaginary signal component frequency domain responses is reduced in response to adjusting the first predetermined value ($K_1$) of the first compensation signal received at the first inputs 260A, 260B, of first and third multipliers 220A, 220B, respectively. The gain of the high pass response of the real and imaginary signal component frequency domains is adjusted in response to receiving the second predetermined value ($K_2$) of the second compensation signal at the first inputs 275A, 275B, of second and fourth multipliers 225A, 225B, respectively.

Figure 4:
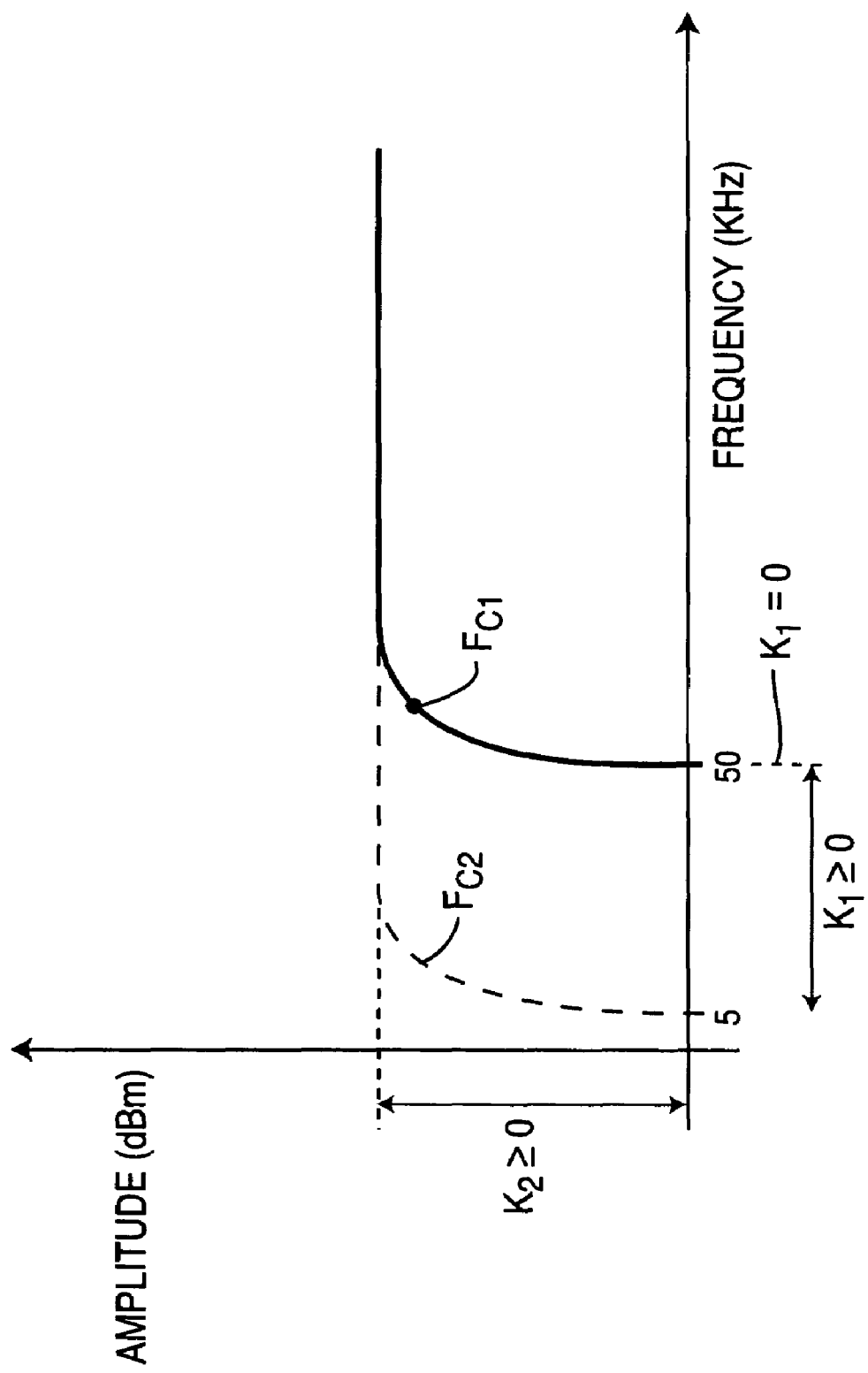
FIG. 4 is a graph illustrating how the compensation values $K_1$ and $K_2$ used in the high pass filter compensation module of the DBB RF receiver of FIG. 2 affect the frequency domain response of the real and imaginary signal components.

The performance of the digital HPFC module 205 is based on the values of $K_1$ and $K_2$. FIG. 4 illustrates how the values of $K_1$ and $K_2$ affect the spectral shape of the frequency domain response of the real and imaginary signal components. Adjusting the value of $K_1$ changes the cutoff frequency of the I and Q signal components from $F_{c1}$ to $F_{c2}$. Adjusting the value of $K_2$ changes the gain of the high pass response of the frequency domain provided by the digital HPFC module 205 by dividing the accumulator output signals 250A, 250B, by $1-K_2$.

It should be understood that the compensation of the I and Q signal components may be implemented by the HPFC module 205 at a sample rate substantially higher than the chip rate (e.g., ten times the chip rate).

While this invention has been particularly shown and described with reference to preferred embodiments, it will be understood by those skilled in the art that various changes in form and details may be made therein without departing from the scope of the invention described hereinabove.

What is claimed is:

1. A digital baseband (DBB) receiver for adjusting a frequency domain response of at least one of real and imaginary signal components of a wireless communication signal, the DBB receiver comprising:
   (a) a demodulator having real and imaginary signal outputs, the demodulator for receiving the communication signal and outputting real and imaginary signal components of the communication signal on the real and imaginary signal outputs;
   (b) a digital high pass filter compensation (HPFC) module having real and imaginary signal paths, the digital HPFC module comprising:
     a real signal input for receiving the real signal component;
     a real compensated signal output for outputting a real compensated output signal;
     a first multiplier having first and second inputs and an output, the first input of the first multiplier for receiving a first compensation signal having a first predetermined value ($K_1$);
     a first adder having first and second inputs and an output, the first input of the first adder being connected to the real signal input of the digital HPFC module, and the output of the first adder being connected to the second input of the first multiplier;
     a second adder having first and second inputs and an output, the first input of the second adder being connected to the output of the first multiplier;
     a first sample delay unit having an input and an output, the input of the first sample delay unit being connected to the output of the second adder;
     a second multiplier having first and second inputs and an output, the first input of the second multiplier for receiving a second compensation signal having a second predetermined value ($K_2$), the second input of the second multiplier being connected to the output of the first sample delay unit, to the second input of the second adder, and to the second input of the first adder; and
     a third adder having first and second inputs and an output, the first input of the third adder being connected to the first input of the first adder, the second input of the third adder being connected to the output of the second multiplier, and the output of the third adder being connected to the real compensated signal output of the digital HPFC module;
     an imaginary signal input for receiving the imaginary signal component;
     an imaginary compensated signal output for outputting an imaginary compensated output signal;
     a third multiplier having first and second inputs and an output, the first input of the third multiplier for receiving the first compensation signal;
     a fourth adder having first and second inputs and an output, the first input of the fourth adder being connected to the imaginary signal input of the digital HPFC module, and the output of the fourth adder being connected to the second input of the third multiplier;

a fifth adder having first and second inputs and an output, the first input of the fifth adder being connected to the output of the third multiplier;

a second sample delay unit having an input and an output, the input of the second sample delay unit being connected to the output of the second adder;

a fourth multiplier having first and second inputs and an output, the first input of the fourth multiplier for receiving the second compensation signal, the second input of the fourth multiplier being connected to the output of the second sample delay unit, to the second input of the fifth adder, and to the second input of the fourth adder; and a sixth adder having first and second inputs and an output, the first input of the sixth adder being connected to the first input of the fourth adder, the second input of the sixth adder being connected to the output of the fourth multiplier, and the output of the sixth adder being connected to the imaginary compensated signal output of the digital HPFC module;

(c) at least one analog real signal path high pass filter (HPF) in communication with the real signal output of the demodulator and the real signal path of the digital HPFC module; and (d) at least one analog imaginary signal path HPF in communication with the imaginary signal output of the demodulator and the imaginary signal path of the digital HPFC module, wherein the digital HPFC module suppresses group delay variation distortion caused by at least one of the analog real and imaginary HPFs.

2. The DBB receiver of claim 1 wherein a cutoff frequency, established by the analog real signal path HPF for the real signal component frequency domain response, is reduced in response to adjusting the first predetermined value ($K_1$) of the first compensation signal.

3. The DBB receiver of claim 1 wherein the gain of the high pass response of the real signal component frequency domain is controlled by adjusting the second predetermined value ($K_2$) of the second compensation signal.

4. The DBB receiver of claim 1 wherein the output of the second multiplier is subtracted from the real signal component via the third adder.

5. The DBB receiver of claim 1 wherein the output of the first sample delay unit is subtracted from the real signal component via the first adder.

6. The DBB receiver of claim 1 wherein a cutoff frequency, established by the analog imaginary signal path HPF for the imaginary signal component frequency domain response, is reduced in response to adjusting the first predetermined value ($K_1$) of the first compensation signal.

7. The DBB receiver of claim 1 wherein the gain of the high pass response of the imaginary signal component frequency domain is controlled by adjusting the second predetermined value ($K_2$) of the second compensation signal.

8. The DBB receiver of claim 1 wherein the output of the fourth multiplier is subtracted from the imaginary signal component via the sixth adder.

9. The DBB receiver of claim 1 wherein the output of the second sample delay unit is subtracted from the imaginary signal component via the fourth adder.

10. The DBB receiver of claim 1 wherein the digital HPFC module is selectively enabled or disabled.

11. A wireless transmit/receive unit (WTRU) for adjusting a frequency domain response of at least one of real and imaginary signal components of a wireless communication signal, the WTRU comprising:

(a) a demodulator having real and imaginary signal outputs, the demodulator for receiving the communication signal and outputting real and imaginary signal components of the communication signal on the real and imaginary signal outputs;

(b) a digital high pass filter compensation (HPFC) module having real and imaginary signal paths, the digital HPFC module comprising:

a real signal input for receiving the real signal component;

a real compensated signal output for outputting a real compensated output signal;

a first multiplier having first and second inputs and an output, the first input of the first multiplier for receiving a first compensation signal having a first predetermined value ($K_1$);

a first adder having first and second inputs and an output, the first input of the first adder being connected to the real signal input of the digital HPFC module, and the output of the first adder being connected to the second input of the first multiplier;

a second adder having first and second inputs and an output, the first input of the second adder being connected to the output of the first multiplier;

a first sample delay unit having an input and an output, the input of the first sample delay unit being connected to the output of the second adder;

a second multiplier having first and second inputs and an output, the first input of the second multiplier for receiving a second compensation signal having a second predetermined value ($K_2$), the second input of the second multiplier being connected to the output of the first sample delay unit, to the second input of the second adder, and to the second input of the first adder; and a third adder having first and second inputs and an output, the first input of the third adder being connected to the first input of the first adder, the second input of the third adder being connected to the output of the second multiplier, and the output of the third adder being connected to the real compensated signal output of the digital HPFC module;

an imaginary signal input for receiving the imaginary signal component;

an imaginary compensated signal output for outputting an imaginary compensated output signal;

a third multiplier having first and second inputs and an output, the first input of the third multiplier for receiving the first compensation signal;

a fourth adder having first and second inputs and an output, the first input of the fourth adder being connected to the imaginary signal input of the digital HPFC module, and the output of the fourth adder being connected to the second input of the third multiplier;

a fifth adder having first and second inputs and an output, the first input of the fifth adder being connected to the output of the third multiplier;

a second sample delay unit having an input and an output, the input of the second sample delay unit being connected to the output of the second adder;

a fourth multiplier having first and second inputs and an output, the first input of the fourth multiplier for receiving the second compensation signal, the second input of the fourth multiplier being connected to the output of the second sample delay unit, to the second input of the fifth adder, and to the second input of the fourth adder; and a sixth adder having first and second inputs and an output, the first input of the sixth adder being connected to the first input of the fourth adder, the second input of the sixth adder being connected to the output of the fourth multiplier, and the output of the sixth adder being connected to the imaginary compensated signal output of the digital HPFC module;

(c) at least one analog real signal path high pass filter (HPF) in communication with the real signal output of the demodulator and the real signal path of the digital HPFC module; and (d) at least one analog imaginary signal path HPF in communication with the imaginary signal output of the demodulator and the imaginary signal path of the digital HPFC module, wherein the digital HPFC module suppresses group delay variation distortion caused by at least one of the analog real and imaginary HPFs.

12. The WTRU of claim 11 wherein a cutoff frequency, established by the analog real signal path HPF for the real signal component frequency domain response, is reduced in response to adjusting the first predetermined value ($K_1$) of the first compensation signal.

13. The WTRU of claim 11 wherein the gain of the high pass response of the real signal component frequency domain is controlled by adjusting the second predetermined value ($K_2$) of the second compensation signal.

14. The WTRU of claim 11 wherein the output of the second multiplier is subtracted from the real signal component via the third adder.

15. The WTRU of claim 11 wherein the output of the first sample delay unit is subtracted from the real signal component via the first adder.

16. WTRU of claim 11 wherein a cutoff frequency, established by the analog imaginary signal path HPF for the imaginary signal component frequency domain response, is reduced in response to adjusting the first predetermined value ($K_1$) of the first compensation signal.

17. WTRU of claim 11 wherein the gain of the high pass response of the imaginary signal component frequency domain is controlled by adjusting the second predetermined value ($K_2$) of the second compensation signal.

18. WTRU of claim 11 wherein the output of the fourth multiplier is subtracted from the imaginary signal component via the sixth adder.

19. The WTRU of claim 11 wherein the output of the second sample delay unit is subtracted from the imaginary signal component via the fourth adder.

20. The WTRU of claim 11 wherein the digital HPFC module is selectively enabled or disabled.

21. An integrated circuit (IC) for adjusting a frequency domain response of at least one of real and imaginary signal components of a wireless communication signal, the IC comprising:

(a) a demodulator having real and imaginary signal outputs, the demodulator for receiving the communication signal and outputting real and imaginary signal components of the communication signal on the real and imaginary signal outputs;

(b) a digital high pass filter compensation (HPFC) module having real and imaginary signal paths, the digital HPFC module comprising:

a real signal input for receiving the real signal component;

a real compensated signal output for outputting a real compensated output signal;

a first multiplier having first and second inputs and an output, the first input of the first multiplier for receiving a first compensation signal having a first predetermined value ($K_1$);

a first adder having first and second inputs and an output, the first input of the first adder being connected to the real signal input of the digital HPFC module, and the output of the first adder being connected to the second input of the first multiplier;

a second adder having first and second inputs and an output, the first input of the second adder being connected to the output of the first multiplier;

a first sample delay unit having an input and an output, the input of the first sample delay unit being connected to the output of the second adder;

a second multiplier having first and second inputs and an output, the first input of the second multiplier for receiving a second compensation signal having a second predetermined value ($K_2$), the second input of the second multiplier being connected to the output of the first sample delay unit, to the second input of the second adder, and to the second input of the first adder; and a third adder having first and second inputs and an output, the first input of the third adder being connected to the first input of the first adder, the second input of the third adder being connected to the output of the second multiplier, and the output of the third adder being connected to the real compensated signal output of the digital HPFC module;

an imaginary signal input for receiving the imaginary signal component;

an imaginary compensated signal output for outputting an imaginary compensated output signal;

a third multiplier having first and second inputs and an output, the first input of the third multiplier for receiving the first compensation signal;

a fourth adder having first and second inputs and an output, the first input of the fourth adder being connected to the imaginary signal input of the digital HPFC module, and the output of the fourth adder being connected to the second input of the third multiplier;

a fifth adder having first and second inputs and an output, the first input of the fifth adder being connected to the output of the third multiplier;

a second sample delay unit having an input and an output, the input of the second sample delay unit being connected to the output of the second adder;

a fourth multiplier having first and second inputs and an output, the first input of the fourth multiplier for receiving the second compensation signal, the second input of the fourth multiplier being connected to the output of the second sample delay unit, to the second input of the fifth adder, and to the second input of the fourth adder; and a sixth adder having first and second inputs and an output, the first input of the sixth adder being connected to the first input of the fourth adder, the second input of the sixth adder being connected to the output of the fourth multiplier, and the output of the sixth adder being connected to the imaginary compensated signal output of the digital HPFC module;

(c) at least one analog real signal path high pass filter (HPF) in communication with the real signal output of the demodulator and the real signal path of the digital HPFC module; and (d) at least one analog imaginary signal path HPF in communication with the imaginary signal output of the demodulator and the imaginary signal path of the digital HPFC module, wherein the digital HPFC module suppresses group delay variation distortion caused by at least one of the analog real and imaginary HPFs.

22. The IC of claim 21 wherein a cutoff frequency, established by the analog real signal path HPF for the real signal component frequency domain response, is reduced in response to adjusting the first predetermined value ($K_1$) of the first compensation signal.

23. The IC of claim 21 wherein the gain of the high pass response of the real signal component frequency domain is controlled by adjusting the second predetermined value ($K_2$) of the second compensation signal.

24. The IC of claim 21 wherein the output of the second multiplier is subtracted from the real signal component via the third adder.

25. The IC of claim 21 wherein the output of the first sample delay unit is subtracted from the real signal component via the first adder.

26. The IC of claim 21 wherein a cutoff frequency, established by the analog imaginary signal path HPF for the imaginary signal component frequency domain response, is reduced in response to adjusting the first predetermined value ($K_1$) of the first compensation signal.

27. The IC of claim 21 wherein the gain of the high pass response of the imaginary signal component frequency domain is controlled by adjusting the second predetermined value ($K_2$) of the second compensation signal.

28. The IC of claim 21 wherein the output of the fourth multiplier is subtracted from the imaginary signal component via the sixth adder.

29. The IC of claim 21 wherein the output of the second sample delay unit is subtracted from the imaginary signal component via the fourth adder.

30. The IC of claim 21 wherein the digital HPFC module is selectively enabled or disabled.

31. A digital high pass filter compensation (HPFC) module having real and imaginary signal paths, the digital HPFC module comprising:

(a) a real signal input for receiving a real signal component of a wireless communication system;

(b) a real compensated signal output for outputting a real compensated output signal;

(c) a first multiplier having first and second inputs and an output, the first input of the first multiplier for receiving a first compensation signal having a first predetermined value ($K_1$);

(d) a first adder having first and second inputs and an output, the first input of the first adder being connected to the real signal input of the digital HPFC module, and the output of the first adder being connected to the second input of the first multiplier;

(e) a second adder having first and second inputs and an output, the first input of the second adder being connected to the output of the first multiplier;

(f) a first sample delay unit having an input and an output, the input of the first sample delay unit being connected to the output of the second adder;

(g) a second multiplier having first and second inputs and an output, the first input of the second multiplier for receiving a second compensation signal having a second predetermined value ($K_2$), the second input of the second multiplier being connected to the output of the first sample delay unit, to the second input of the second adder, and to the second input of the first adder; and (h) a third adder having first and second inputs and an output, the first input of the third adder being connected to the first input of the first adder, the second input of the third adder being connected to the output of the second multiplier, and the output of the third adder being connected to the real compensated signal output of the digital HPFC module;

(i) an imaginary signal input for receiving an imaginary signal component of the wireless communication signal;

(j) an imaginary compensated signal output for outputting an imaginary compensated output signal;

(k) a third multiplier having first and second inputs and an output, the first input of the third multiplier for receiving the first compensation signal;

(l) a fourth adder having first and second inputs and an output, the first input of the fourth adder being connected to the imaginary signal input of the digital HPFC module, and the output of the fourth adder being connected to the second input of the third multiplier;

(m) a fifth adder having first and second inputs and an output, the first input of the fifth adder being connected to the output of the third multiplier;

(n) a second sample delay unit having an input and an output, the input of the second sample delay unit being connected to the output of the second adder;

(o) a fourth multiplier having first and second inputs and an output, the first input of the fourth multiplier for receiving the second compensation signal, the second input of the fourth multiplier being connected to the output of the second sample delay unit, to the second input of the fifth adder, and to the second input of the fourth adder; and (p) a sixth adder having first and second inputs and an output, the first input of the sixth adder being connected to the first input of the fourth adder, the second input of the sixth adder being connected to the output of the fourth multiplier, and the output of the sixth adder being connected to the imaginary compensated signal output of the digital HPFC module.

* * * * *

UNITED STATES PATENT AND TRADEMARK OFFICE
CERTIFICATE OF CORRECTION

PATENT NO. : 7,280,618 B2  Page 1 of 1
APPLICATION NO. : 10/747644
DATED : October 9, 2007
INVENTOR(S) : Alpaslan Demir It is certified that error appears in the above-identified patent and that said Letters Patent is hereby corrected as shown below:

On the Title Page,

Item (75), Inventors:, page 1, left column, line 3, after "Tanbir Haque", delete "Long Island, NY" and insert therefor --Long Island City, NY--.

At claim 16, column 11, line 41, before "WTRU", insert --The--.

At claim 17, column 11, line 46, before "WTRU", insert --The--.

At claim 18, column 11, line 51, before "WTRU", insert --The--.

Signed and Sealed this

Twenty-fifth Day of March, 2008

JON W. DUDAS
*Director of the United States Patent and Trademark Office*